United States Patent [19]
Lam et al.

[11] Patent Number: 6,030,666
[45] Date of Patent: *Feb. 29, 2000

[54] METHOD FOR MICROWAVE PLASMA SUBSTRATE HEATING

[75] Inventors: James Lam; David Hodul, both of Oakland, Calif.

[73] Assignee: Lam Research Corporation, Fremont, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/831,495

[22] Filed: Mar. 31, 1997

[51] Int. Cl.⁷ ..................................................... H05H 1/00
[52] U.S. Cl. .......................... 427/539; 427/543; 427/553; 427/575; 427/588; 204/192.3
[58] Field of Search ............................ 118/722, 723 MP, 118/723 MW; 427/571, 539, 535, 575, 543, 579, 574, 573, 533, 588

[56] References Cited

U.S. PATENT DOCUMENTS

| | | | |
|---|---|---|---|
| 4,340,462 | 7/1982 | Koch ................................. | 204/192.32 |
| 4,401,054 | 8/1983 | Matsuo et al. ........................... | 427/571 |
| 4,579,618 | 4/1986 | Celestino et al. .................. | 204/298.34 |
| 4,593,168 | 6/1986 | Amada ..................................... | 427/588 |
| 4,948,458 | 8/1990 | Ogle .................................... | 204/192.32 |
| 5,198,718 | 3/1993 | Davis et al. ......................... | 313/359.1 |
| 5,200,232 | 4/1993 | Tappan et al. .......................... | 427/569 |
| 5,241,245 | 8/1993 | Barnes et al. ........................... | 118/623 |
| 5,262,029 | 11/1993 | Erskine et al. ..................... | 204/298.15 |
| 5,279,865 | 1/1994 | Chebi et al. ............................. | 427/575 |
| 5,304,279 | 4/1994 | Coultas et al. ..................... | 204/298.16 |
| 5,401,350 | 3/1995 | Patrick et al. ..................... | 204/298.06 |

FOREIGN PATENT DOCUMENTS

| | | |
|---|---|---|
| 63-186874 | 8/1988 | Japan . |
| 1-298173 | 12/1989 | Japan . |
| 5-86479 | 4/1993 | Japan . |
| 7-335570 | 12/1995 | Japan . |
| WO 91/00613 | 1/1991 | WIPO . |

*Primary Examiner*—Nam Nguyen
*Assistant Examiner*—Steven H. Ver Steeg
*Attorney, Agent, or Firm*—Burns, Doane, Swecker & Mathis, L.L.P.

[57] ABSTRACT

A method of microwave heating of a substrate in a plasma processing chamber wherein a heatup gas is supplied into the processing chamber, the heatup process gas is energized with microwave power to heat an exposed surface of the substrate, a reactant gas is supplied into the processing chamber and the reactant gas is energized into a plasma gas state to process the substrate.

18 Claims, 11 Drawing Sheets

METHOD FOR MICROWAVE PLASMA SUBSTRATE HEATING

FIELD OF THE INVENTION

The present invention relates generally to a method for heating a substrate with microwave energy. More specifically, the present invention relates to a method for heating a substrate with microwave energy in preparation for chemical vapor deposition.

BACKGROUND OF THE INVENTION

Chemical vapor deposition (CVD) is a process for forming a material layer on a substrate by the reaction of gas phase reactants at or near a substrate surface. Vacuum processing chambers are generally used for CVD and etching of materials on substrates by supplying process gas to the vacuum chamber and applying a radio frequency (rf) field to the gas. Examples of parallel plate, transformer coupled plasma (TCP™, also called inductively coupled plasma or ICP), and electron-cyclotron resonance (ECR) reactors are disclosed in commonly owned U.S. Pat. Nos. 4,340,462; 4,948,458; and 5,200,232. The substrates are held in place within the vacuum chamber during processing by substrate holders. Conventional substrate holders include mechanical clamps and electrostatic clamps (ESC). Examples of mechanical clamps and ESC substrate holders are provided in commonly owned U.S. Pat. No. 5,262,029 and commonly owned U.S. application Ser. No. 08/401,524 filed on Mar. 10, 1995. Substrate holders in the form of an electrode can supply rf power into the chamber, as disclosed in U.S. Pat. No. 4,579,618.

Plasma processing systems wherein an antenna coupled to an rf source energizes gas into a plasma state within a processing chamber are disclosed in U.S. Pat. Nos. 4,948,458; 5,198,718; 5,241,245; 5,304,279; and 5,401,350. In such systems, the antenna is located outside the processing chamber and the rf energy is supplied into the chamber through a dielectric window. Such processing systems can be used for a variety of semiconductor processing applications such as etching, deposition, resist stripping, etc.

Thermal CVD processes typically rely on heating of the substrate surface in order to promote the reaction(s) which result in formation of compound(s) on the substrate surface. Conventionally, the substrate surface is heated by applying an rf bias voltage to the substrate. The use of the rf bias voltage to heat a substrate to promote the reactions generates a DC bias in the plasma near the surface of the substrate. This DC bias accelerates ions toward the substrate surface, and the ensuing collision of the ions transfers energy to the substrate, thereby heating the substrate.

A problem with this conventional heating of the substrate surface with an rf bias voltage is that it causes sputtering of the material on the substrate due to ion bombardment. This can cause damage to the substrate surface. Various gases have been used as the reacting gases in an attempt to lessen the sputtering while heating the substrate with the rf bias voltage. The problem of sputtering remains, however.

Other methods of heating the substrate surface have also been proposed, including heating lamps, resistor heaters, and other in-situ substrate heating methods. These methods are limited by slow response time and process variability due to previous processing of the substrate or the condition of the substrate.

There is thus a need for a method for minimizing sputtering during heating of a substrate surface for processing such as CVD processing.

SUMMARY OF THE INVENTION

Accordingly, it is an object of the present invention to provide a process for minimizing sputtering while heating a substrate surface as an initial step in plasma processing such as CVD processing. This and other objects are met by a method of microwave heating of a substrate in a plasma processing chamber wherein a heatup gas is supplied into the processing chamber, the heatup process gas is energized with microwave power to heat an exposed surface of the substrate, a reactant gas is supplied into the processing chamber and the reactant gas is energized into a plasma gas state to process the substrate.

BRIEF DESCRIPTION OF THE DRAWINGS

The foregoing, and other objects, features, and advantages of the present invention will be more readily understood upon reading the following detailed description in conjunction with the drawings in which.

DETAILED DESCRIPTION OF THE PREFERRED EMBODIMENTS

According to the present invention, a method is provided for minimizing sputtering while heating a substrate surface (such as a semiconductor substrate, flat panel display, etc.) as a step in processing of the substrate. For example, the substrate surface can be heated in preparation for CVD processing, etch processing, etc., by exciting a heatup gas in a plasma processing chamber. The heatup gas can be composed of one or more ionizable reacting or non-reacting gases including, for example, oxygen, argon, silane, silicontetraflouride, helium, neon, krypton, xenon, nitrogen or mixtures thereof. The plasma can be provided by any suitable source such as an electron cyclotron resonance (ECR) tool, a parallel plate reactor, an inductively coupled reactor, a transformer, coupled reactor, a helicon, a helical resonator or the like.

Figure 1:
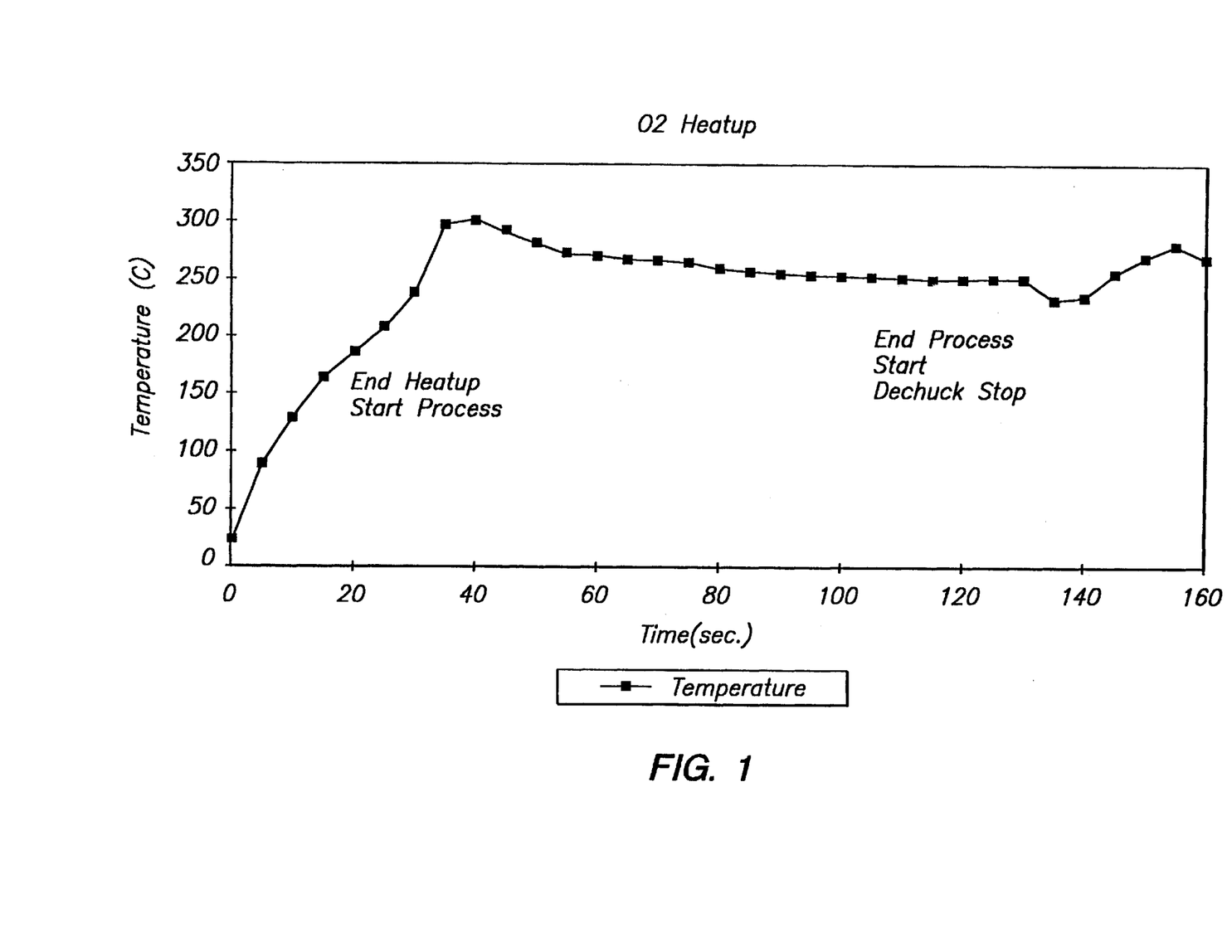
FIG. 1 illustrates graphically a temperature profile of a substrate surface during a CVD process.

According to a first embodiment wherein the present invention is used in conjunction with a CVD process, the substrate surface is heated as an initial step in high density plasma (e.g. $10^{11}$–$10^{12}$ ions/cm$^3$) processing by applying microwave power to a heatup gas in a plasma processing chamber of a DSM™ 9900 or an EPIC™ tool manufactured by Lam Research Incorporated, the Assignee of the present application. FIG. 1 illustrates graphically a temperature profile of a substrate surface during CVD of a $SiO_x$ film on the substrate. The CVD processing begins by energizing a heatup gas with microwave power to heat the substrate surface. FIG. 1 illustrates a heating profile which results by energizing oxygen gas with microwave power to heat the substrate surface to approximately 90% of its processing temperature, in this example 270° C. As shown in FIG. 1, this initial heating step takes approximately 38 seconds. Next, suitable reactant gases are supplied and actual processing of the substrate begins, with switching on of the rf bias voltage supplied by the substrate support, causing a small jump in substrate temperature to approximately 300° C. The temperature of the substrate surface gradually decreases during the CVD processing to about 270° C., due to the ESC voltage and He backside temperature control. At around 130 seconds, the processing ends and dechucking begins, which causes the temperature of the substrate surface to decrease. When the dechucking step ends, the temperature rises again.

According to the first embodiment of the present invention, by eliminating rf bias power supplied by the substrate support from the initial step of heating the substrate surface, the DC bias in the plasma is greatly reduced. Thus, sputtering of the substrate surface to be processed is greatly reduced. The energy used to heat the substrate is preferably supplied only by the microwave energy. Heating rates can be adjusted by controlling the microwave power density in the plasma. The heating method according to the first embodiment of the present invention is thus independent of many substrate variables, such as substrate backside roughness and previous processing.

In the following figures, application of a chucking force to the substrate and supply of helium back pressure between the substrate holder and the substrate are omitted during the initial heatup step to minimize the heat loss to the substrate support and reduce the time of the heatup step. The processes are carried out in a LAM DSM™ tool and the substrate surface temperatures shown in the figures represent measurements using a convection probe and/or phosphor dot on the backside of the substrate. Sputter rates of these heatups were recorded on both oxide coated and TiN coated substrates by running the heatup and measuring the before and after thickness of the oxide and TiN coatings. Compared to a sputter rate on the order of 1000 Å/min when using rf bias power for heating a substrate coated with $SiO_2$, the microwave heating according to the invention can reduce the sputter rate well over 50%, preferably over 75%, and more preferably over 90% to around 20 Å/min.

Figure 2:
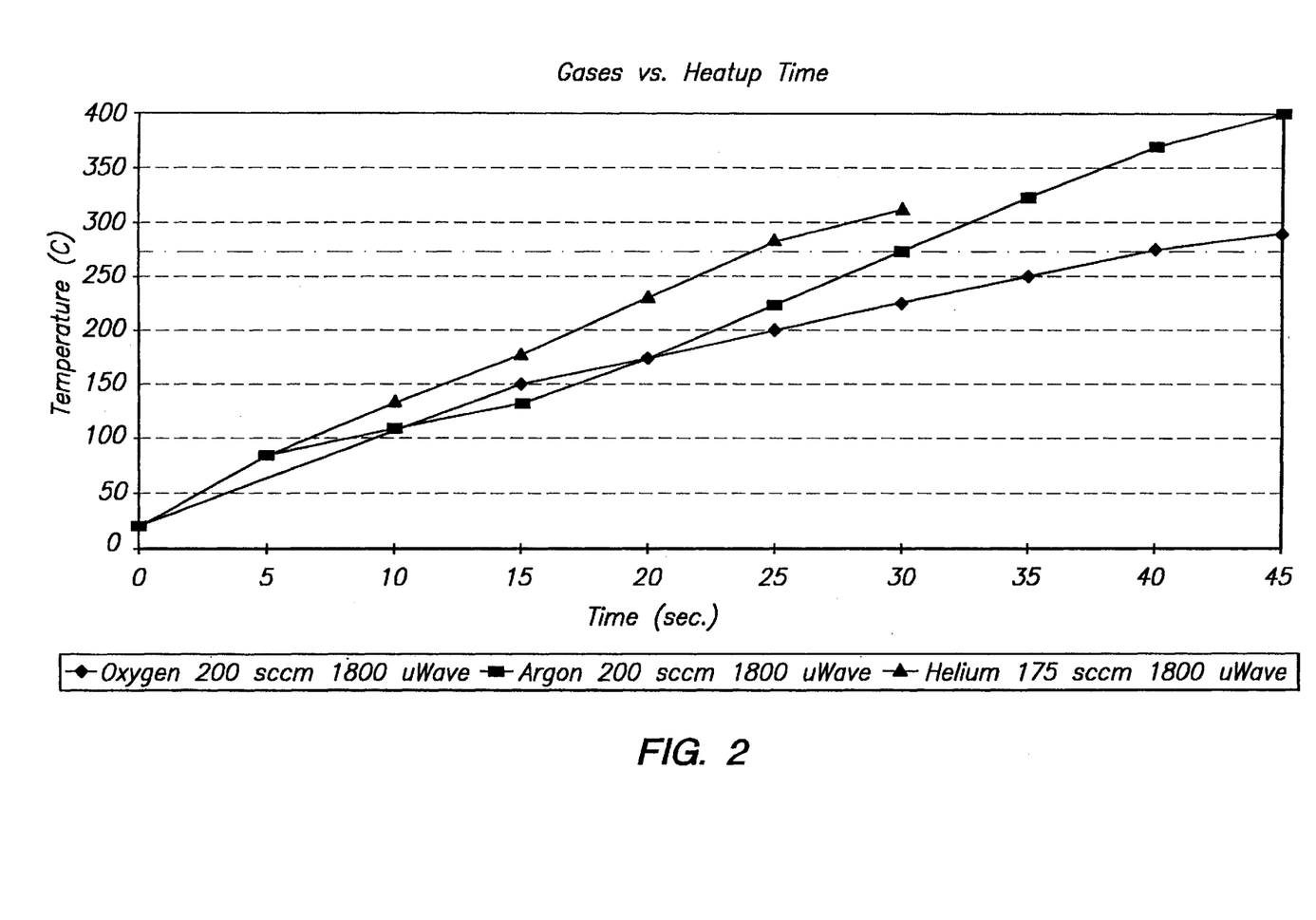
FIG. 2 illustrates graphically heatup times for a substrate surface applying microwave power to various reactant gases.

FIG. 2 illustrates graphically heatup times for a substrate surface applying microwave power to various heatup gases. In FIG. 2, the heatup times for oxygen, argon, and helium heatup gases are represented. The microwave power applied to heat up these gases is constant at 1800 watts. The line with superimposed diamonds represents oxygen flowing at 200 scam, the line with superimposed boxes represents argon flowing at 200 sccm, and the line with superimposed triangles represents helium flowing at 175 sccm. As can be seen from FIG. 2, under the described conditions, helium heats up the substrate fastest, heating to 270° C. in approximately 24 seconds, followed by argon which heats the substrate to 270° C. in approximately 30 seconds, and then oxygen, which heats the substrate to 270° C. in approximately 40 seconds.

Figure 3A:
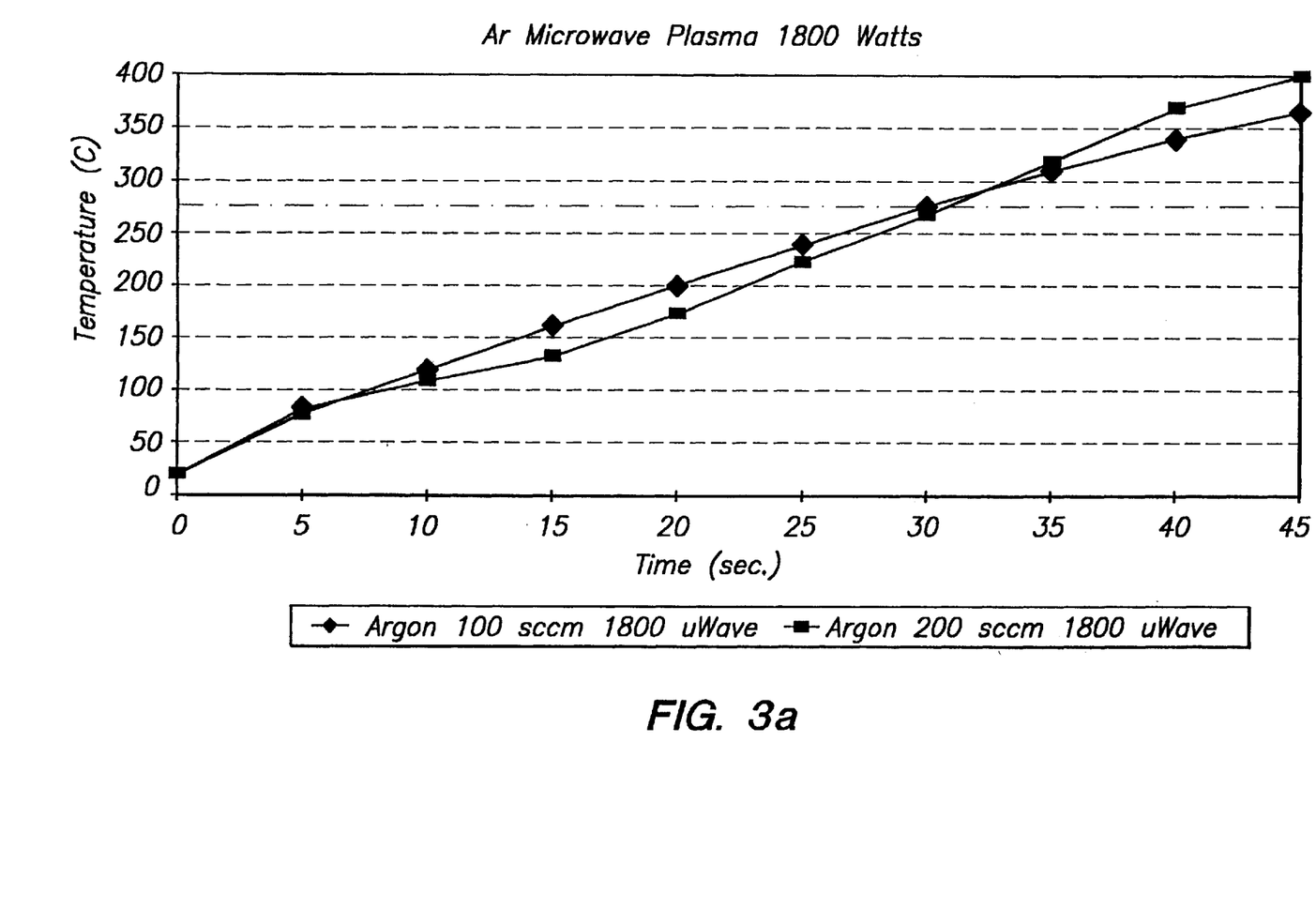
FIGS. 3a and 3b illustrate graphically a heatup time for a substrate surface applying microwave power to argon.

FIGS. 3a and 3b illustrate graphically heatup times for a substrate surface applying microwave power to argon. In FIG. 3a, argon is energized with a constant amount of microwave power set at 1800 watts. The line with superimposed diamonds represents argon flowing at 100 sccm, and the line with superimposed boxes represents argon flowing at 200 sccm. As can be seen from FIG. 3a, argon flowing at 100 sccm heats to 270° C. approximately 2 seconds faster than argon flowing at 200 sccm.

Figure 3B:
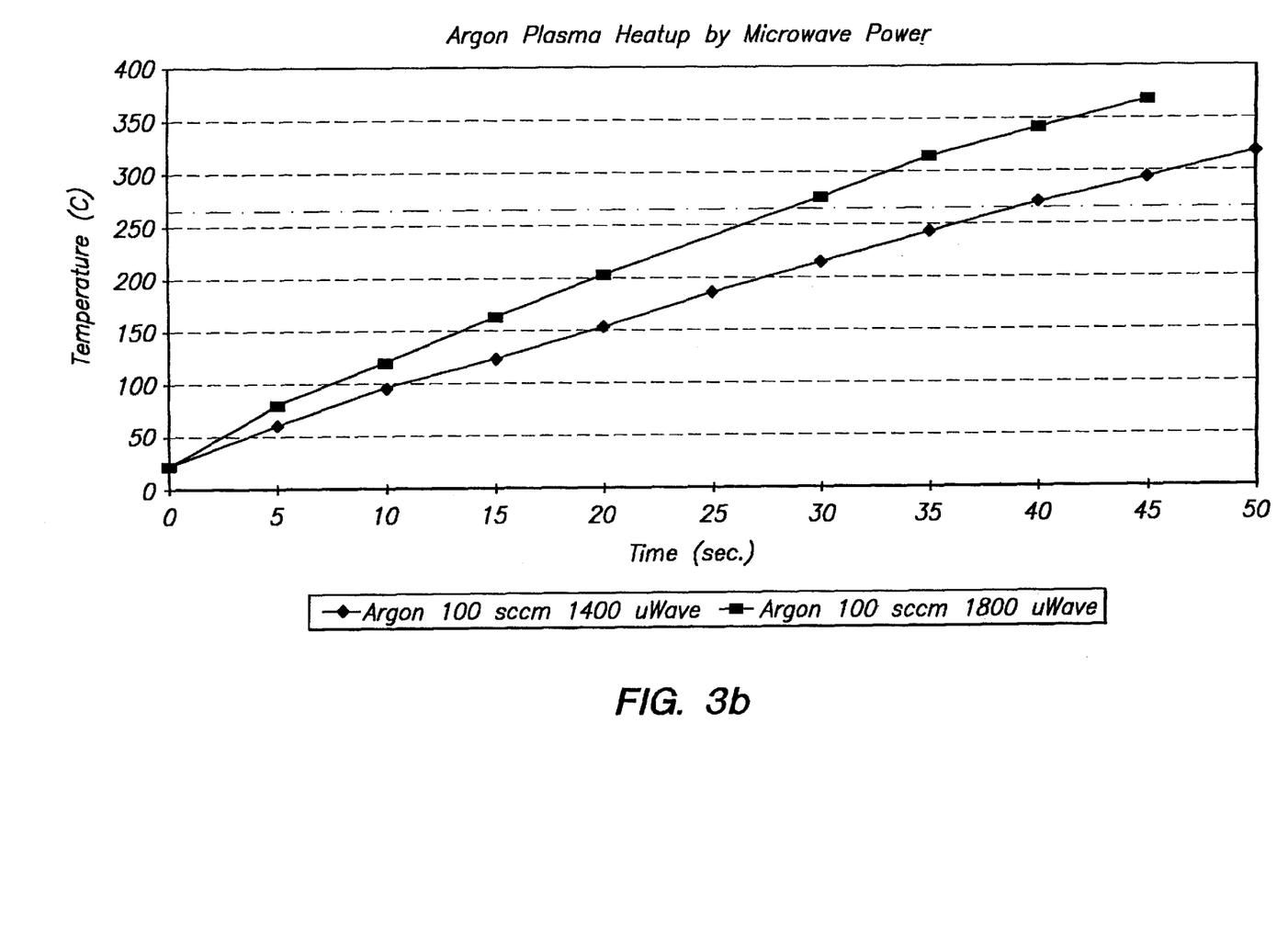

In FIG. 3b, the flow rate of argon is constant at 100 sccm. The line with superimposed diamonds represents argon energized with 1400 watts of microwave power, and the line with superimposed boxes represents argon energized with 1800 watts of microwave power. As can be seen from FIG. 3b, argon energized with 1800 watts heats to 270° C. approximately 10 seconds faster than argon energized with 1400 watts.

Figure 4A:
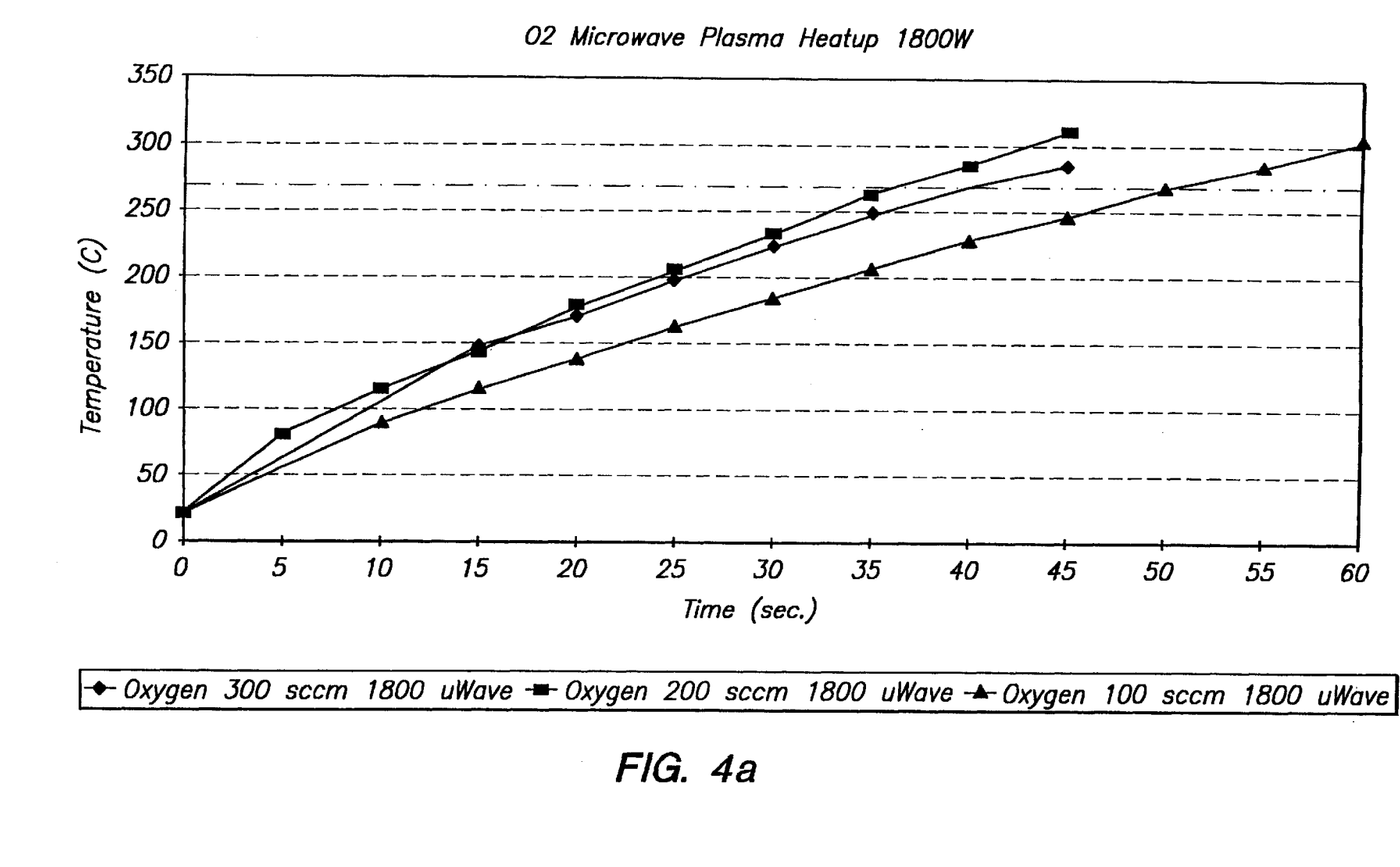
FIG. 4a and 4b illustrate graphically a heatup time for a substrate surface applying microwave power to oxygen.

FIG. 4a and 4b illustrate graphically a heatup time for a substrate surface applying microwave power to oxygen. In FIG. 4a, the oxygen is heated with a constant amount of microwave power set at 1800 watts. The line with superimposed triangles represents oxygen flowing at 300 sccm, the line with superimposed diamonds represents oxygen flowing at 200 sccm, and the line with superimposed boxes represents oxygen flowing at 100 sccm. As can be seen from FIG. 4a, oxygen flowing at 100 sccm heats to 270° C. the fastest, in approximately 35 seconds, followed by oxygen flowing at 200 sccm, and then oxygen flowing at 300 sccm.

Figure 4B:
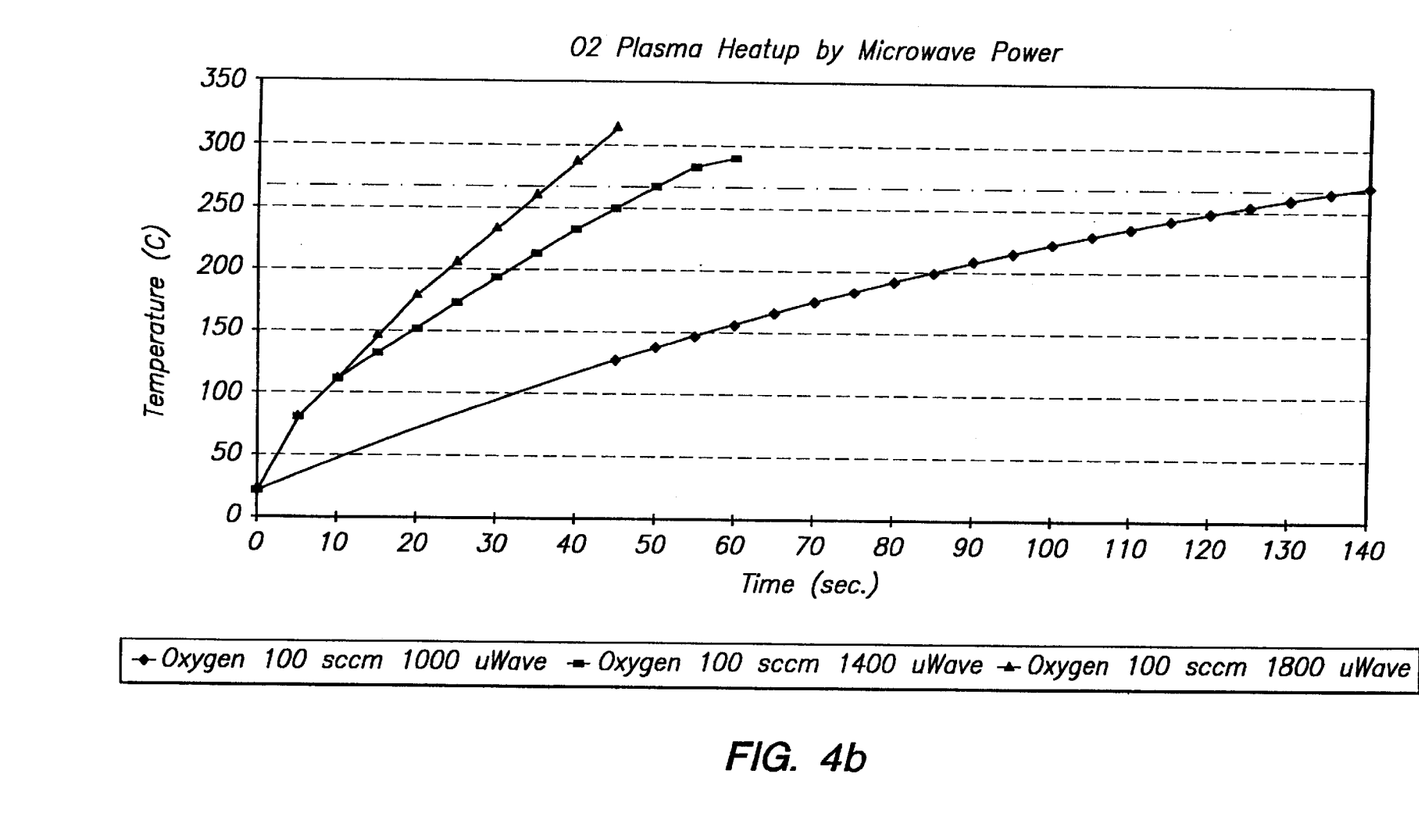

In FIG. 4b, the flow rate of oxygen is constant at 100 sccm. The line with superimposed diamonds represents oxygen energized with 1000 watts of microwave power, the line with superimposed boxes represents oxygen energized with 1400 watts of microwave power, and the line with superimposed triangles represents oxygen energized with 1800 watts of microwave power. As can be seen from FIG. 4b, oxygen energized with 1800 watts heats up to 270° C. the fastest, in approximately 38 seconds, followed by oxygen energized at 1400 watts, and then oxygen energized at 1000 watts, which takes approximately 140 seconds.

Figure 5:
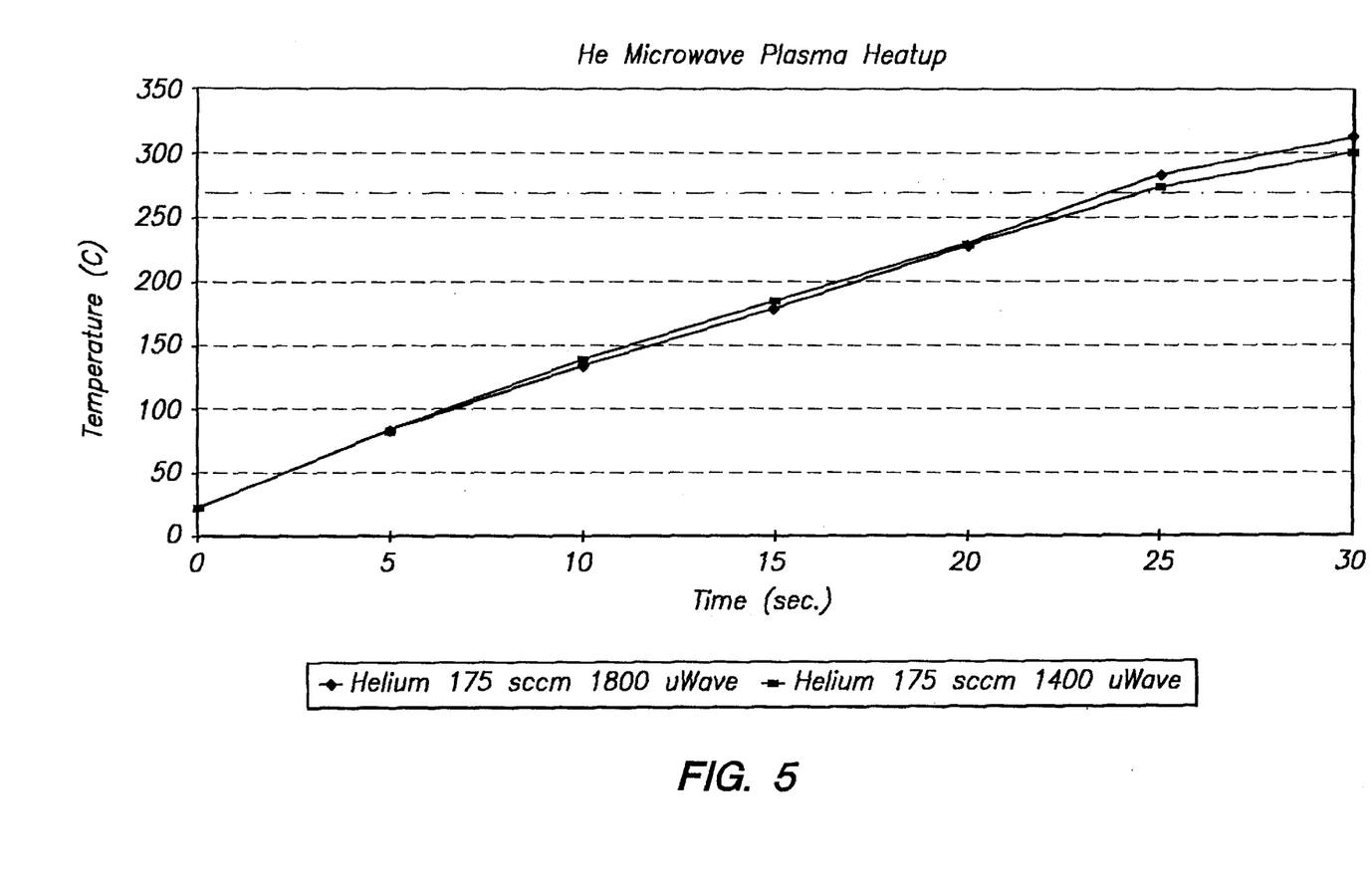
FIG. 5 illustrates graphically a heatup time for a substrate surface applying microwave power to helium.

As can be seen from FIGS. 3a,b and 4a,b, the oxygen and argon plasmas are very stable at various flow rates and microwave powers. In contrast, the helium plasma is unstable at low flow rates. For instance, at 100 sccm and 140 sccm He, the He plasma is unstable or would not light. However, flow rates of 175 scam He provide a stable plasma, especially at higher microwave power levels. This can be seen from FIG. 5 which illustrates graphically the heatup time for a substrate surface applying microwave power to helium. In FIG. 5, the flow rate of helium is constant at 175 sccm. The line with superimposed diamonds represents helium energized with 1800 watts of microwave power, and the line with superimposed boxes represents helium energized with 1400 watts of microwave power. As can be seen from FIG. 5, there is little difference between the heatup times to 270° C. with microwave power at 1400 watts and 1800 watts, although the microwave power at 1800 watts heats the helium to 270° C. approximately a second faster. Thus, while He may be difficult to ionize and remove from the reaction chamber with a turbo pump, it otherwise is a good candidate for substrate heating.

Auxiliary gases such as argon or oxygen can be added to the helium to help ignite the He plasma, but the subsequent removal of such auxiliary gases may extinguish or destabilize the He plasma.

Although not shown, a similar result is achieved for neon. While most neon plasmas ignite readily, it is, like helium, unstable at low flow rates. Further, at 100 sccm Ne the reflected power is about one-half of the applied power, whereas at 200 sccm, the microwaves tuned perfectly. The heatup time is about 90 seconds for neon flowing at 100 sccm.

Another candidate, nitrogen, produces less satisfactory results, with a heatup time of about 47 seconds under the same conditions. Also, nitrogen might have an effect on the material that is being heated up and produce nitrides, like oxides when an oxygen plasma is used.

According to the first embodiment of the present invention, heating a substrate surface using only microwave energy is achievable with comparable times to those conditions using an rf bias voltage to heat the substrate surface, if the substrate is not chucked during the heatup step. Argon may be preferable to He or oxygen for heating up the substrate surface since argon heats the substrate to the desired temperature in about 25 seconds compared to 30 seconds for oxygen. Also, if oxygen is used, a side effect of an oxygen plasma as a descumer should be considered. The difference in heating rate for oxygen and argon appears to be due to the mass of the ions in the plasma.

There is a small correlation between gas flows and heat up times. This change is probably due to a higher ion flux, and higher ion density in the plasma. There seems to be little difference in the heatup rates using argon, but the difference is noticeable with oxygen. Microwave power is the major factor in the amount of energy applied to the substrate. With increasing power, the heatup time is reduced, possibly due to higher ion density from the increased power.

A heated chuck can help heat the substrate surface, even without chucking the wafer. For a helium plasma, using a heated chuck results in faster heatup times, quickly bringing the substrate surface temperature to about 400° C. in about 11 seconds for a low flow rate and low microwave power. However, use of a heated chuck presents a problem of cooling the substrate during the CVD process, the effective cooling rate of the backside helium being greatly lessened.

The heatup process according to the first embodiment of the present invention greatly minimizes sputtering of the exposed substrate surface. In the case of silicon dioxide coated silicon wafers, compared to the conventional heatup using rf bias energy which substantially abates $SiO_2$ on the order of 1000 Å/min, heating the substrate with microwave energy according to the invention provides minimal ablation of the $SiO_2$ at a rate of approximately 20 Å/min. This is a new and unexpected result achieved according to the process of the invention. There is little effect in sputter rate due to ion mass, and the bias induced by the microwave plasma is very small, under the threshold of sputtering. According to the invention, the uniformity of the substrate temperature is related only to the uniformity of the plasma. Other factors that typically affect the temperature uniformity in the case of conventional substrate heating such as the chuck, rf bias, and backside helium, are not factors in substrate surface temperature uniformity when only using the microwave power to excite the plasma.

Regarding tuning of the microwaves, there is a lag time during the changeover of the gases during the process. For example, when reactant gases such as silane and other gases are supplied to the reaction chamber to start the processing of the substrate, and the heatup gases are switched off, there is a dramatic change in the impedance of the plasma and a large percentage of redirected power during this tune time. To minimize the disturbance, the gases that are used to heat up the substrate are preferably compatible with or utilize one or more of the reactant gases used in the CVD process.

According to exemplary embodiments, Table 1 shows heatup and sputtering rates for various heatup gases which can be used for heating a substrate prior to depositing a layer of material such as silicon dioxide.

TABLE 1

| Minimum Heatup Time: to 270° C. | $O_2$: | 35 sec. 5" and 8" |
| --- | --- | --- |
| | | 60 sec. to 370 8" |
| | Ar: | 27 sec. 5" and 8" |
| | | 40 sec. to 350 8" |
| | He: | 22 sec. 5" |
| | Ne: | 90 sec. 5"* |
| | $N_2$: | 47 sec. 5"* |
| | Baseline w/rf: | 18 sec. |
| | | *Plasma not stable |
| Sputtering rate of $SiO_2$ | $O_2$: | 10Å/min avg |
| | | 16Å/min max 8" |
| | | 21Å/min avg |
| | | 42Å/min max 5" |
| | Baseline w/rf: | 1048Å/min avg |
| | | 1379Å/min max 8" |

Processing conditions typically depend on the CVD process and on the type and/or size of substrate. For instance, during CVD processing the rf bias power can be scaled to the size of the substrate. The microwave heatup process can produce an initial heatup of the substrate surface to 270° C., with the substrate surface staying within 20° of 270° C. throughout the deposition process.

Minor modifications may be needed for smooth substrates and possibly patterned substrates. The process is effective for both convection probes and infrared ("IR") probes. Preferably, substrates to be run should be tested with a phosphor dot substrate if using the convection probe, to insure that there are no temperature anomalies. The "IR" probes and the phospor dot substrates are direct measures of temperatures while the convection probe is a secondary measurement.

In the following figures, substrate surface temperatures measured with a convection probe and a phosphor dot on the backside of the substrate are represented.

Figure 6:
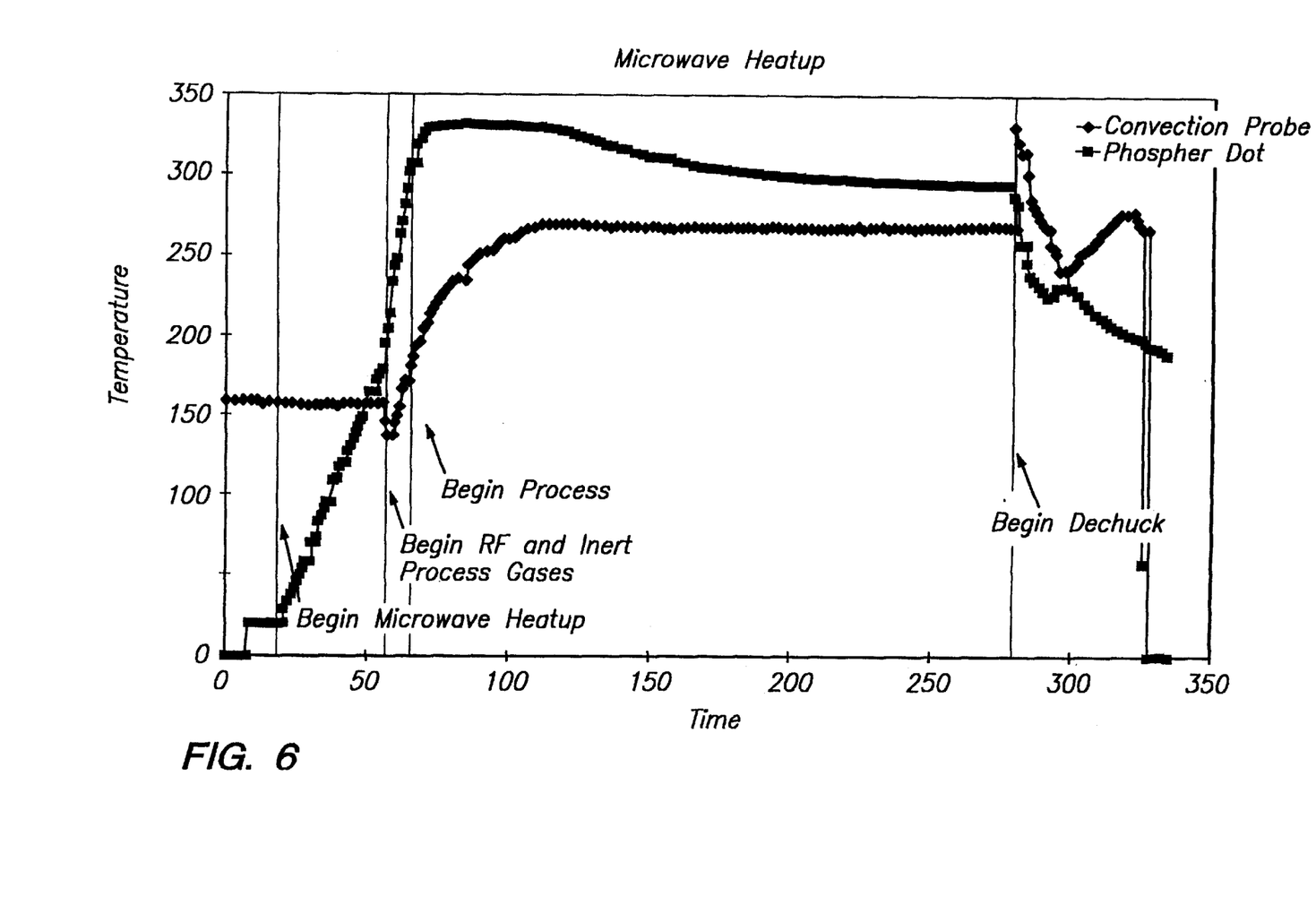
FIG. 6 illustrates graphically a temperature profile of a substrate surface during a CVD process applying microwave power in a heatup step.

FIG. 6 illustrates graphically a temperature profile of a substrate surface during CVD processing applying microwave power to heat the substrate surface. In FIG. 6, the line with superimposed diamonds represents results using a convection probe, and the line with superimposed boxes represent results using a phosphor dot.

Figure 7:
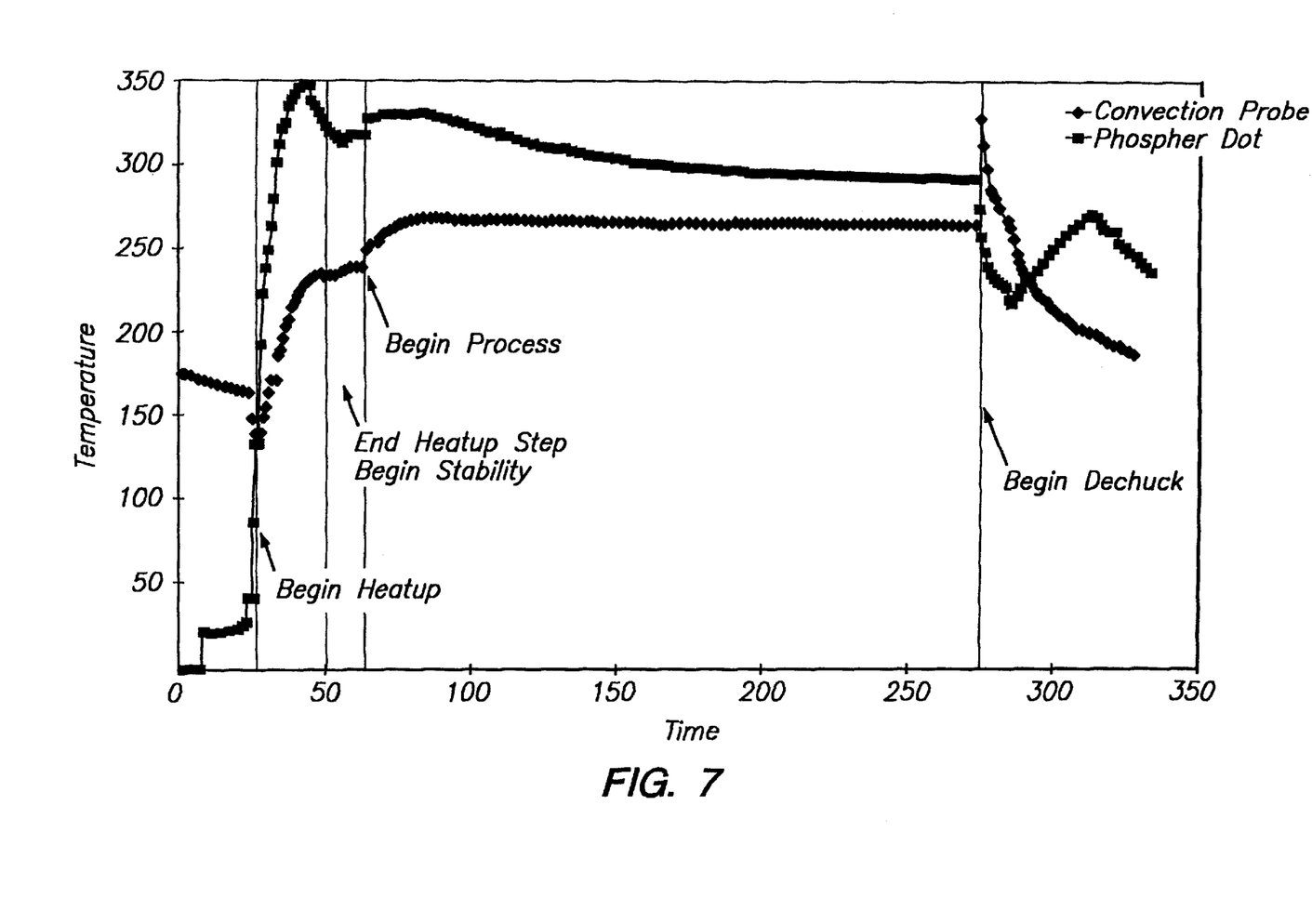
FIG. 7 illustrates graphically a temperature profile of a substrate surface during a conventional CVD process wherein microwave power and rf bias power are used during a heatup step.

FIG. 7 illustrates graphically a temperature profile of a substrate surface during CVD processing applying conventional rf bias power from the substrate support to heat the substrate surface. In FIG. 7, the line with superimposed diamonds represents results using a convection probe, and the line with superimposed boxes represent as results using a phosphor dot.

There are distinct differences between FIGS. 6 and 7. The most obvious difference is the temperature overshoot. In FIG. 7, the initial heatup step heats the substrate surface to 350° C., while in FIG. 6, the initial heatup step heats the substrate surface to 330° C.

The convection probe that is used to monitor the substrate surface temperature responds very slowly to the actual substrate surface temperature. Thus, while the temperature profile appears to read the 270° C. temperature much quicker, this is actually due to the higher overshoot of the actual substrate temperature.

Varying the minimum backside helium or helium pressure does not make a significant difference in the response of the convection probe. This can be seen from comparing FIGS. 8 and 9.

Figure 8:
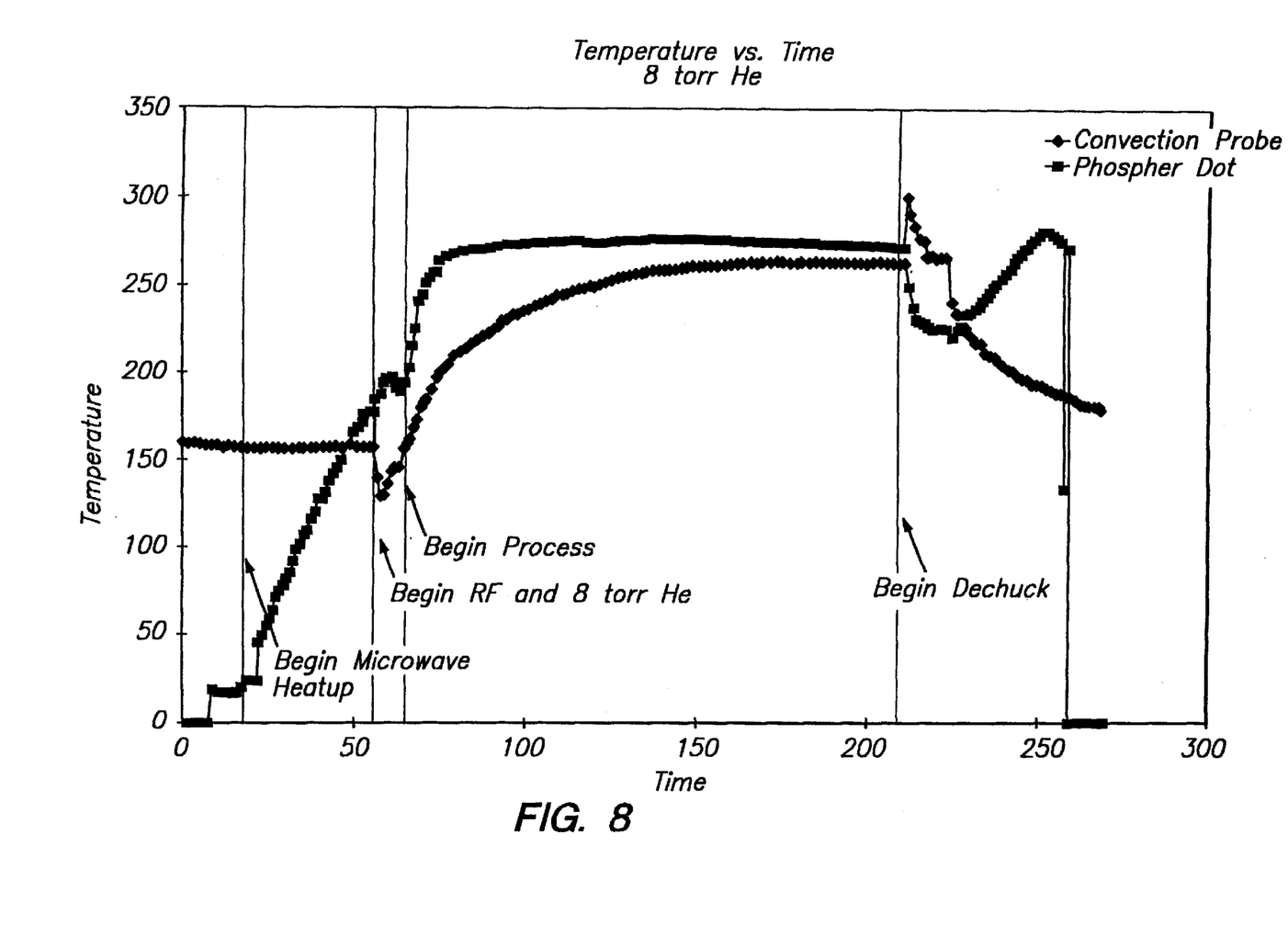
FIG. 8 illustrates graphically a temperature profile of a substrate surface during a CVD process with 8 torr of helium backside pressure.

FIG. 8 illustrates graphically a temperature profile of a substrate surface during CVD processing with 8 torr helium backside pressure. In FIG. 8, the line with superimposed diamonds represents results using a convection probe, and the line with superimposed boxes represents results using a phosphor dot.

Figure 9:
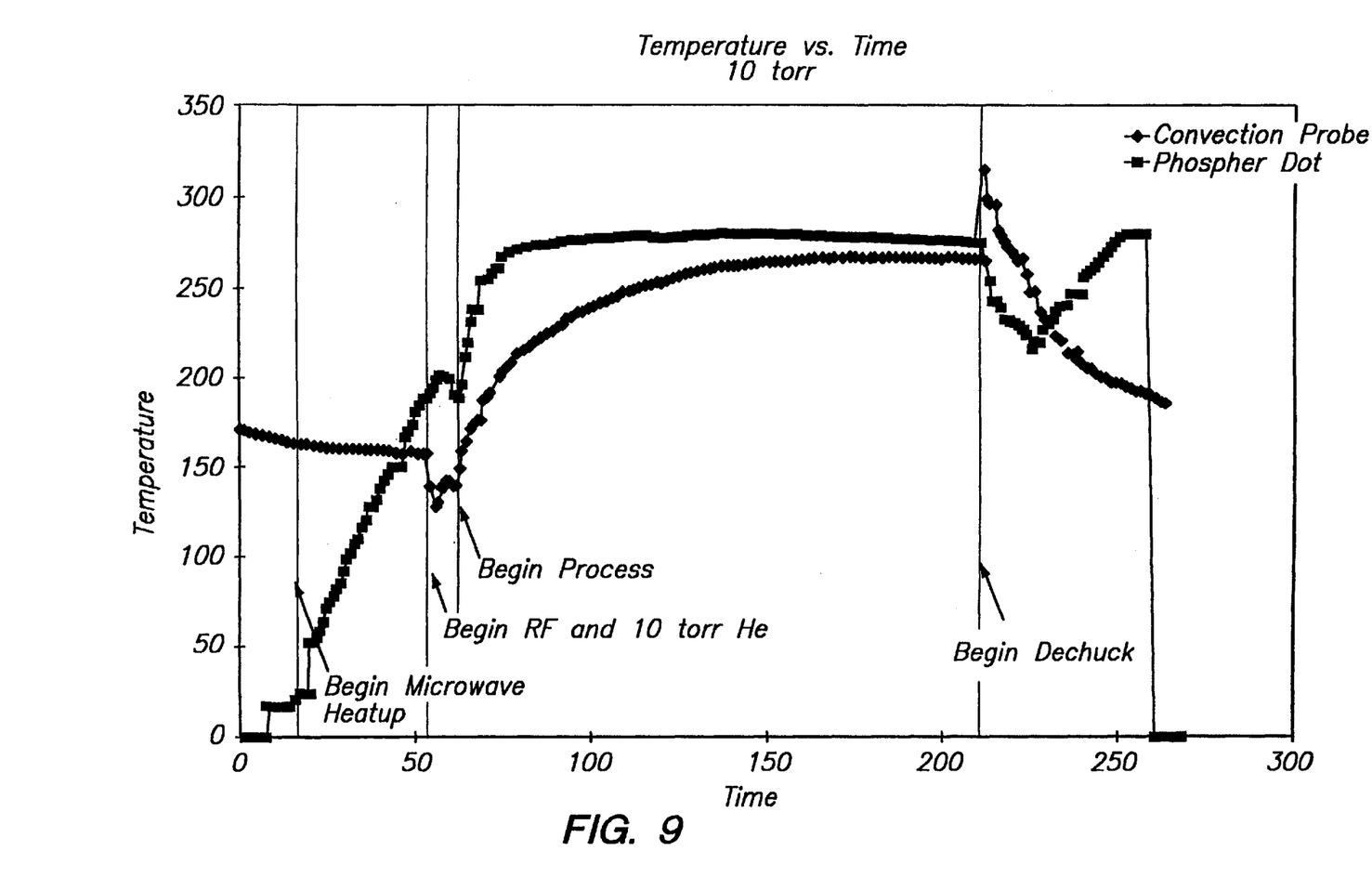
FIG. 9 illustrates graphically a temperature profile of a substrate surface during a CVD process with 10 torr of helium backside pressure.

FIG. 9 illustrates graphically a temperature profile of a substrate surface during CVD processing with 10 torr helium backside pressure. In FIG. 9, the line with superimposed diamonds represents results using a convection probe, and the line with superimposed boxes represents results using a phosphor dot.

The microwave convection probe data suggests a faster response, but this is, again, due to the higher substrate temperature. Helium backside pressure does not play a significant part in changing the response time of the convection probe at typical helium backside pressures between approximately 5 and 10 torr.

In the embodiment described above, heating of a substrate surface as an initial step in preparation for CVD processing is performed by the application of microwave power. In an alternate embodimaent, the microwave power can be supplemented with low levels of if power to assist in the heating.

The above-described exemplary embodiments are intended to be illustrative in all respects, rather than restrictive, of the present invention. Thus, the present invention is capable of many variations in detailed implementation that can be derived from the description contained herein by a person skilled in the art. All such variations and modifications are considered to be withi the scope and spirt of the present invention as defined by the following claims.

What is claimed is:

1. A method of processing an exposed surface of a substrate in a plasma processing chamber, comprising steps of:
   supplying heatup gas comprising oxygen into a plasma processing chamber containing a substrate to be processed;
   heating the substrate by energizing the heatup gas into a plasma gas state with microwave power so as to heat an exposed surface of the substrate with the microwave energized heatup gas, the substrate being heated such that the exposed surface reaches a threshold temperature and the substrate being heated without applying an rf bias to the substrate;
   supplying reactant gas into the plasma processing chamber; and
   processing the substrate by energizing the reactant gas into a plasma gas state so as to process the exposed surface of the substrate with the energized reactant gas.

2. The method of claim 1, wherein the heatup gas further comprises argon, krypton, xenon, nitrogen, helium, neon and mixtures thereof.

3. The method of claim 1, wherein during the heating step the microwave power is applied at a power level of at least 1000 watts.

4. The method of claim 1, wherein during the heating step the heatup gas is supplied at a rate of at least 50 sccm.

5. The method of claim 1, wherein during the heating step the microwave power is adjusted to heat the exposed surface to at least 90% of a processing temperature at which the exposed surface is processed during the processing step.

6. The method of claim 1, wherein the substrate comprises a semiconductor wafer and the processing step comprises depositing a dielectric layer on the exposed surface of the wafer.

7. The method of claim 6, wherein the reactant gas includes a silicon-containnng gas and an oxygen-containing gas.

8. The method of claim 7, wherein the silicon-containing gas comprises $SiH_4$ or $SiF_4$ and the oxygen-containing gas comprises $O_2$.

9. The method of claim 1, wherein during the heating step the exposed surface is heated without applying a chucking force or backside cooling to the substrate.

10. The method of claim 9, wherein the substrate is supported on an electrostatic chuck during the heating and processing steps.

11. The method of claim 1, wherein the plasma processing chamber comprises an ECR tool having a plasma formation chamber adjacent a reaction chamber, the substrate being supported in the reaction chamber.

12. The method of claim 1, wherein microwave power is supplied to the plasma processing chamber during the heating and processing steps.

13. The method of claim 1, wherein the threshold temperature is at least 200° C.

14. The method of claim 1, wherein the heating step is performed in less than 60 seconds and the exposed surface is sputtered during the heating step at a sputtering rate of less than 500 Å/min.

15. The method of claim 14, wherein the sputtering rate is less than 100 Å/min.

16. The method of claim 14, wherein the sputtering rate is less than 50 Å/min.

17. The method of claim 1, wherein the substrate is supported on an electrostatic chuck during the heating and processing steps, the heating step being performed without applying a clamping force to the substrate and without backside cooling of the substrate, and the processing step being performed while applying a clamping force and backside cooling to the substrate.

18. The method of claim 1, wherin the exposed surface is processed during the processing step with a highly density plasma.

* * * * *